United States Patent [19]
Collins, III

[11] Patent Number: 5,631,808
[45] Date of Patent: May 20, 1997

[54] CARD RETENTION LATCH

[75] Inventor: Phillip K. Collins, III, Kirkland, Wash.

[73] Assignee: The Boeing Company, Seattle, Wash.

[21] Appl. No.: 438,628

[22] Filed: May 10, 1995

[51] Int. Cl.[6] .................................................. H05K 7/20
[52] U.S. Cl. .................. 361/801; 361/747; 361/752; 361/754; 361/798; 439/153; 439/325; 439/296
[58] Field of Search .............................. 361/728, 747, 361/754, 798, 740, 752, 759, 801, 787; 439/152, 153, 157, 160, 296, 325, 55, 327

[56] References Cited

U.S. PATENT DOCUMENTS

| | | | |
|---|---|---|---|
| 3,245,546 | 4/1966 | Stuhler | 211/41 |
| 4,914,552 | 4/1990 | Kecmer | 361/415 |
| 4,947,289 | 8/1990 | Dynie | 361/415 |
| 5,140,501 | 8/1992 | Takahashi et al. | 361/798 |
| 5,293,303 | 3/1994 | Fletcher et al. | 361/798 |
| 5,364,282 | 11/1994 | Tondreault | 439/157 |
| 5,396,401 | 3/1995 | Nemoz | 361/690 |
| 5,398,164 | 3/1995 | Goodman et al. | 361/752 |

FOREIGN PATENT DOCUMENTS

4105948A1  8/1992  Germany .

*Primary Examiner*—Leo P. Picard
*Assistant Examiner*—Anthony Dinkins
*Attorney, Agent, or Firm*—Christensen O'Connor Johnson & Kindness PLLC

[57] ABSTRACT

A latch for retaining printed circuit boards (PCB) or other types of daughter cards (29) in a card file (11) is disclosed. Two latch mechanisms (43a and 43b), one located adjacent the outer corner of each card, engage latch slots (35) when the cards (29) are correctly installed. Each latch mechanism (43a and 43b) includes a latch housing (45), a plunger assembly (47) mounted in the latch housing (45), and large coil springs (49a and 49b) that create a force in a direction parallel to the direction of card installation. The large coil springs (49a and 49b) urge the plunger assembly (47) away from the direction of card installation and out of alignment with an opening (77) in the latch housing (45). The plunger assembly (47) includes a plunger housing (53), a latch pin (55), a smaller coil spring (59), and a latch pin retraction lever (57). The plunger housing (53) includes a chamber (87) having an open end that is alignable with the opening (77) in the latch housing (45) when the large cob springs (49a and 49b) are sufficiently compressed. The latch pin (55) and the small coil spring (59) lie orthogonal to the direction of card installation and are mounted in the chamber (87) of the plunger housing. As a result, when the open end of the chamber is aligned with the latch housing opening, the latch pins are free to slide outwardly, into the latch slots if the card file is suitably positioned. The latch pin retraction lever (57) is used to withdraw the latch pins to flow card removal. A flag (105) is exposed when the latch pins (55) are extended.

24 Claims, 2 Drawing Sheets

CARD RETENTION LATCH

TECHNICAL AREA

This invention relates to latch mechanisms and, more particularly, to latch mechanisms for retaining daughter cards in card files.

BACKGROUND OF THE INVENTION

Card file assemblies are well known and commonly used in many environments, including onboard commercial jet airplanes. Card file assemblies house daughter cards that include a male connector block located along an edge of the card that mates with female connectors mounted on a mother board located at the back of the card file when a daughter card is properly inserted. The replaceable daughter cards used on airplanes are sometimes referred to as line replaceable units (LKUs). Daughter cards are installed in card files by inserting the cards into slots formed in the card file chassis and pressing the cards rearwardly until the card connector mates with the card file's mother board connectors. The mating forces of high-pin-count, low-insertion-force connectors can be up to 35 pounds. As a result, it is difficult to assess the point at which connector engagement is complete. Incomplete connector engagement can result in the appearance of a card failure when none has occurred. The likelihood of card failure appearances is particularly true with card files located in a vibration environment, such as onboard an airplane.

Incomplete connector engagement can occur in several ways. Card connections may be incompletely mated or, even though initially fully mated, card connections can become demated when exposed to vibration and shock, such as occurs onboard an aircraft.

In order to overcome the incomplete initial mating and demating problems briefly described above, card retention devices have been developed. Previously developed card insertion and retention devices have a variety of problems and disadvantages. Many daughter card insertion and retention devices require special tools to remove and install a card. Obviously, if an installer does not have the correct tool readily available, time (which is at a premium in an airline environment) is required to find the tool before a card can be replaced. Tolerance buildup in card insertion and retention devices that can result in a significant gap between mated connectors, which can compromise electrical integrity, is another problem associated with prior art card insertion and retention devices.

With respect to connector mating force, a number of attempts have been made to handle the large forces often required to ensure complete connector engagement when a daughter card is inserted into a card file. The prior attempts can be broken into two groups.

One group includes lever-like devices that provide a 4:1 or greater mechanical advantage during card insertion. See, for example, U.S. Pat. No. 4,914,552, entitled Printed Circuit Board Installation and Retaining Apparatus, by Robert P. Keemer; U.S. Pat. No. 4,947,289, entitled Latch Mechanism for a Plug-in Cartridge or the Like, by Ernest R. Dynie; U.S. Pat. No. 5,293,303, entitled Circuit Board Injector/Ejector Device For a Circuit Board Enclosure, by Neil C. Fletcher et al.; U.S. Pat. No. 5,396,401, entitled Modular Printed Circuit Board Holder Structure, Capable of Engaging, In Drawer-Like Fashion, In a Rack of an Electronic Installation, by Girard Nemoz; U.S. Pat. No. 5,398, 164, entitled Printed Circuit Card Latching and Stiffening Assembly, by Walter A. Goodman et al.; and German Offenglegungsschfifi DE 41 05 948. The major problem associated with the lever arm devices is that they can easily produce an excessive connector mating force, which can result in the breaking of connector contacts or overcoming a connector's mechanical key features designed to prevent a card from being installed in an incorrect slot.

The second group consists of fasteners, which are captive at both ends of a bracket mounted to a daughter card. The connectors are drawn together and become mated as the fasteners are secured to receptacles on the card file. Like lever arm devices, fasteners can produce excessive forces that can result in the breaking of contacts and/or the overcoming of a connector's mechanical key features if a card is installed in an incorrect slot.

A variety of other approaches have been proposed to positively retain daughter cards in a card file. One approach is to modify lever arm devices of the type described in the foregoing patents by adding a spring-loaded clip to the end of the lever arm. As the card is being installed with the lever arm, the jaws of the spring clip open and close to engage a roll-pin installed in the card. Once engaged, the lever is prevented from opening, thus preventing the card from backing out. One of the disadvantages of this approach is that a connector gap can exist, due to tolerance buildup, when the jaws are engaging the roll-pin. In addition, this approach has the disadvantages of the lever ann devices described above.

Another approach consists of providing the card file with a reinforced front cover with strips of stiff robber padding secured to the inside of the cover. The cover padding provides positive card retention when the cover is closed and the padding is in contact with the outer edges of installed cards. That is, when the cover is closed, the padding impinges on the cards and, thus, prevents the cards from backing out of their related file slots. The problem with this approach is that the rubber padding can take on a permanent set (i.e., remain deflected after load is removed) over time. If this occurs, and a card with a length at the upper end of the tolerance range is replaced with a card at the lower end, a gap will exist between the outer end of the card and the rubber padding when the cover is closed. The gap will allow the card to back out, transferring the gap to the previously mated connectors.

A variation on the foregoing approach is to eliminate the rubber pad and rely on the front cover for card retention. This approach requires designing an allowable nominal gap between the card and the cover. The problem with this approach is that, if one or more card connectors have not been fully seated when the cover is closed, contact between the outer edge of the cards and the cover may result in damage to the cards or the cover, or both.

The present invention is directed to providing a card retention latch that overcomes the disadvantages of prior art card retention mechanisms of the type described above and of other types of card retention mechanisms, such as the one described in U.S. Pat. No. 3,245,546, entitled Self-Locking Handle, by W. B. Stuhler.

SUMMARY OF THE INVENTION

In accordance with this invention, a latch for retaining printed circuit boards (PCBs) or other types of daughter cards in a card file is provided. Two latch mechanisms, one located adjacent the outer corner of each card, engage a latch slot when cards are correctly installed. More specifically, each latch mechanism includes a latch housing, a plunger assembly mounted in the housing, and large coil springs that create a force in a direction parallel to the direction of card installation. The coil springs urge the plunger assembly away from the direction of card installation and out of alignment with an opening in the latch housing. The plunger assembly includes a plunger housing, a latch pin, a smaller coil spring, and a latch pin retraction lever. The plunger housing includes a chamber having an open end that is alignable with the opening in the latch housing when the large coil springs are sufficiently compressed. The latch pin and smaller coil spring lie orthogonal to the direction of card installation and are mounted in the chamber in the plunger housing. As a result, when the open end of the chamber is aligned with the latch housing opening, the latch pin is free to slide outwardly. When a card is suitably installed, the outwardly sliding latch pins slip into one of the latch slots. The latch pin retraction lever is used to withdraw the latch pins to allow card file removal.

In accordance with further aspects of this invention, the latch pin retraction levers include a flag that is exposed when the related latch pin is extended and hidden when the related latch pin is withdrawn.

In accordance with other aspects of this invention, the plunger assemblies include torsion springs that interact with the latch pin retention levers to assure that the related flags are not exposed until the related latch pins are fully extended and have engaged a latch slot in the card file chassis.

As will be readily appreciated from the foregoing description, the invention provides a new and improved card retention latch that overcomes the disadvantages of card retention mechanisms of the type described above. The use of a plunger assembly that is spring-loaded in the direction opposite the direction of card installation compensates for card-to-card and card-file-to-card-file tolerance variations. The use of latch pins that move in a direction orthogonal to the direction of card installation into slots maintains cards fixed in position after installation and prevents vibration and shock in the surrounding environment from resulting in connector demating. The use of a flag provides a positive indication to an installer that a card is appropriately installed.

BRIEF DESCRIPTION OF THE DRAWINGS

The foregoing and other aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
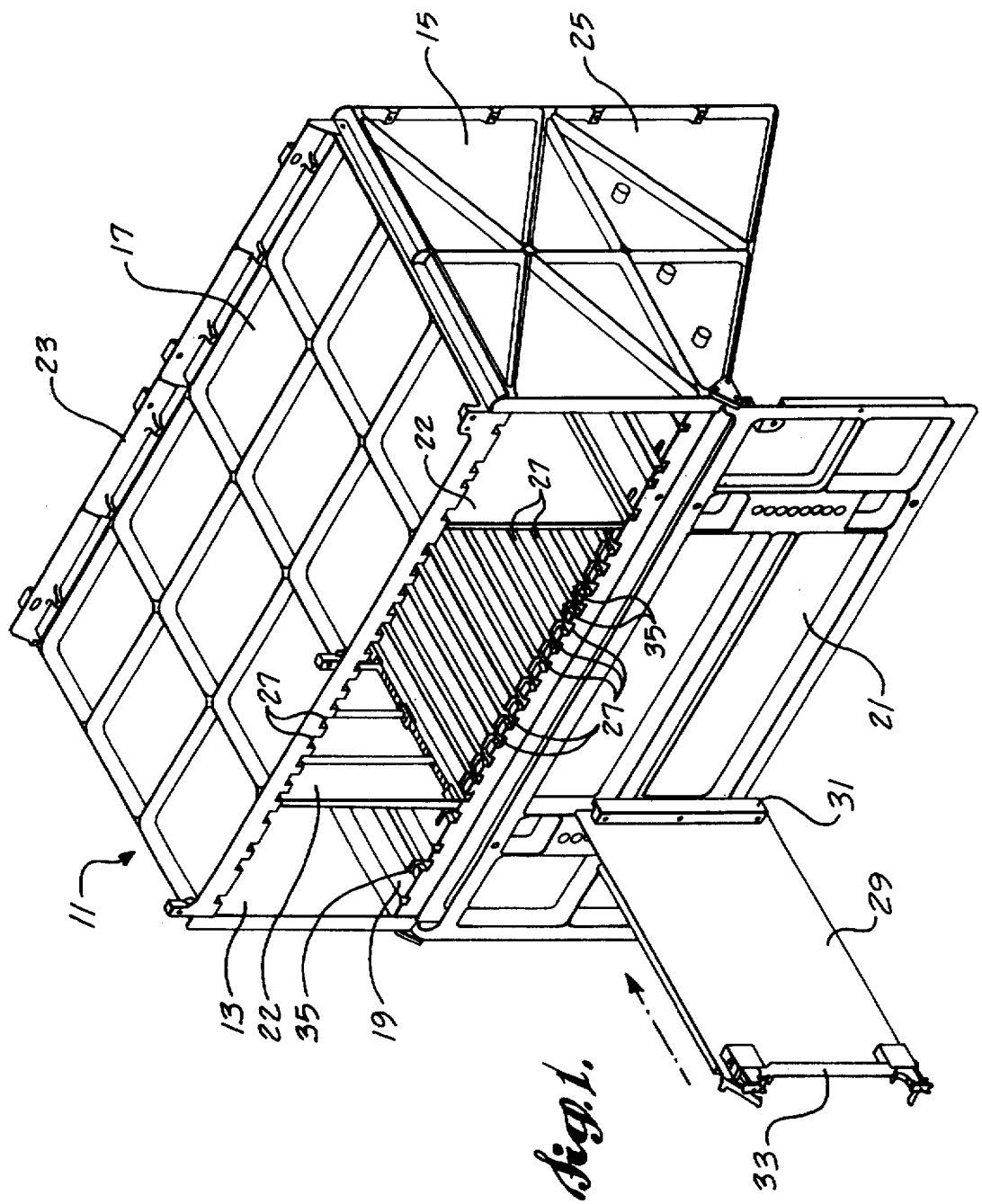
FIG. 1 is a pictorial view of a card file and a daughter card including a card retention latch formed in accordance with this invention.

FIG. 1 illustrates a card file 11 of a type suitable for use in various environments, including onboard an airplane. The chassis of the card file 11 includes a pair of opposed side walls 13 and 15, a top 17, a bottom 19, and a cover 21. The side walls 13 and 15, the top 17, and the bottom 19 form an open front compartment that is closed by the cover 21. Located inwardly of the side walls 11 and 13 are one or more vertically oriented divider and stiffener walls 22. The side walls 13 and 15 and the top wall 17 include flanges 23 and 25 located along the rear of the card file 11 for attaching the card file 11 to a suitable support structure (not shown).

The facing surfaces of the top 17 and the bottom 19 include aligned card slots 27 shaped and sized to receive the upper and lower edges of daughter cards 29. In a conventional manner, the daughter cards are vertically oriented and inserted in a side-by-side manner in the chamber defined by the card file 11. The daughter cards may include printed circuits and, thus, form printed circuit boards (PCBs) or support elements other than electrical elements. In the airplane industry, daughter cards are sometimes referred to as line replaceable units (LRUs).

Located along the rear edge of each daughter card 29 is a male connector block 31. The male connector block includes a plurality of holes sized and positioned to mate with female connector elements located on the mother board of the card file 11. Since the male/female connection of a daughter card to the mother board of a card file is well known and does not, per se, form part of this invention, such connections are not further described here.

The invention includes a plurality of latch slots 35 located near the open front of the card file 11, adjacent the card slots 27. As will be better understood from the following description, the latch slots 35 are positioned to receive the pins of a card retention latch 33 located along the outer edge of the daughter cards 29 inserted into the card file. More specifically, the card retention latch 33 is oriented along the outer vertical edge of the daughter cards 29, i.e., the vertical edge remote from the edge containing the male connector block 31.

Figure 2:
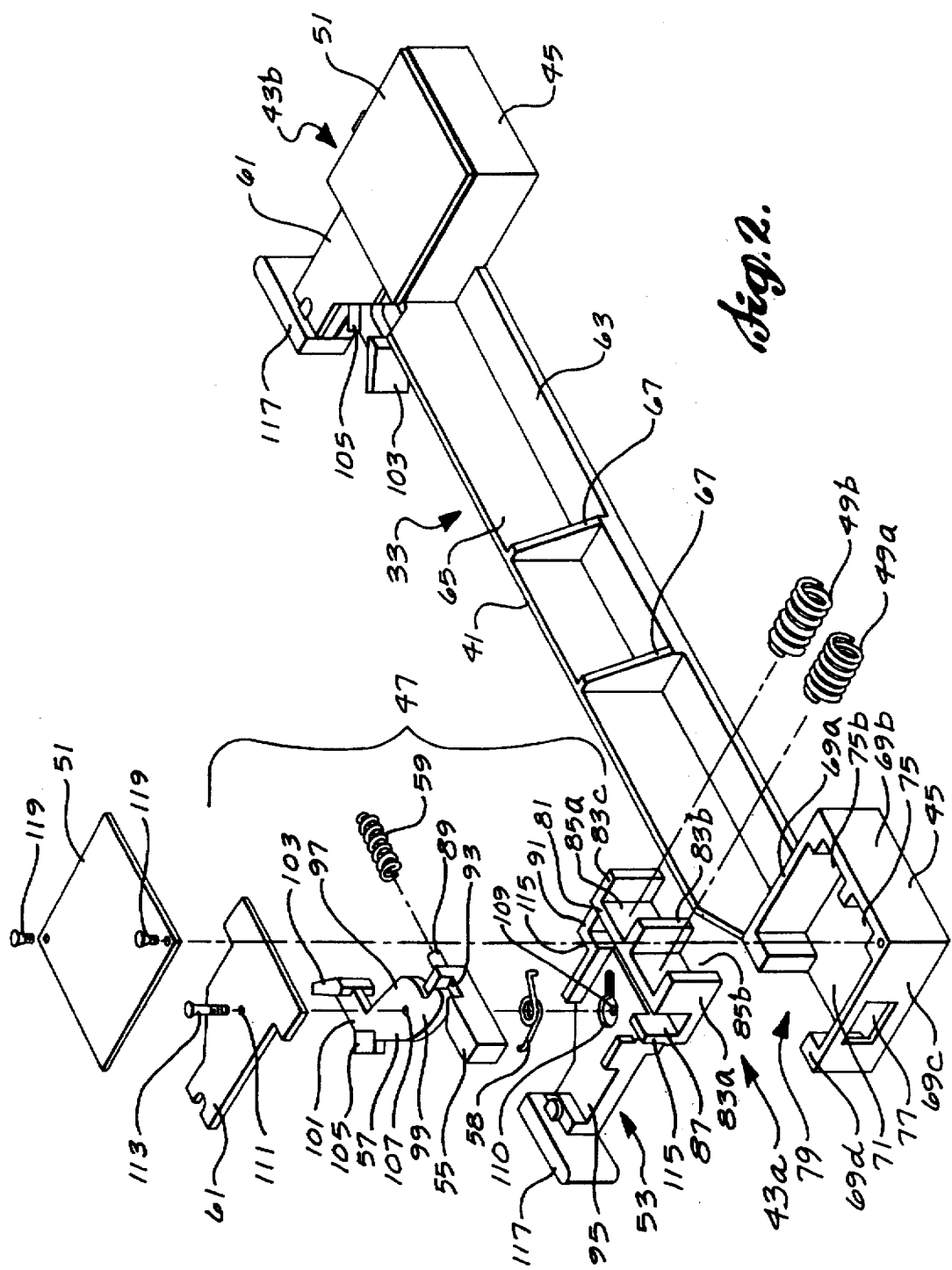
FIG. 2 is an exploded view of a card retention latch formed in accordance with this invention.

FIG. 2 illustrates a card retention latch 33 formed in accordance with the invention oriented horizontally, rather than vertically, for ease of illustration. The card retention latch 33 shown in FIG. 2 includes a connecting bar 41 and two mirror-image latch mechanisms 43a and 43b located on opposite ends of the connecting bar 41. Each of the latch mechanisms 43a and 43b includes a latch housing 45, a plunger assembly 47, a pair of large coil springs 49a and 49b, and a latch housing cover 51. The plunger assembly 47 includes a plunger housing 53, a latch pin 55, a latch pin retraction lever 57, a torsion spring 58, a small coil spring 59, and a plunger housing cover 61.

The connecting bar 41 is elongate and has an L-shaped cross-sectional configuration. One of the flanges 63 of the connecting bar 41 is positioned against and attached to one of the faces of a daughter card 29, along the edge of the daughter card 29 remote from the edge containing the male connector block 31. The other flange 65 of the connecting bar 41 extends orthogonally outwardly from the face of the daughter card 29. Preferably, two or more integral supports 67 extend between the flanges 63 and 65 of the elongate connecting bar 41.

Located at either end of the elongate connecting bar 41 is a latch housing 45. The latch housings 45 are rectangular shaped and formed integrally with the connecting bar 41. The latch housings 45 include four walls 69a, 69b, 69c, and 69d and a back wall 70. The front of the latch housing is open. The latch housing cover 51 encloses the open front of the latch housing 45 in the manner hereinafter described.

The outer surface of the first wall 69a is integral with the adjacent end of the connecting bar 41. The second wall 69b lies orthogonal to the first wall 69a and faces the male connector block 31 located at the opposite end of the daughter card 29. The inner surface of the second wall 69b includes a pair of adjacent slots 75a and 75b that extend inwardly from the open front. The width of the slots 75a and 75b is slightly greater than the outer diameter of the large coil springs 49a and 49b. Preferably, the inner ends of the slots 75a and 75b have a semicircular shape.

The third wall 69c lies orthogonal to the second wall 69b and includes a rectangular hole 77. The fourth wall 69d lies orthogonal to the third wall 69c. The center of the fourth wall, which lies along the outer edge of the daughter card 29, is cut away to produce an opening 79.

The plunger housing 53 is generally flat and includes a plurality of chambers or cavities defined by walls located around the edges of the plunger housing. More specifically, the plunger housing 53 includes end wall 81. Extending outwardly from the end wall 81 are three parallel protrusions 83a, 83b, and 83c. The end wall 81 and the protrusions 83a, 83b, and 83c have an E-shaped configuration. The width of the spacings 85a and 85b between the adjacent protrusions 83a and 83b and 83b and 83c is the same and generally the same as the width of the slots 75a and 75b formed in the second wall 69b of the latch housing 45. This width is slightly greater than the diameter of the large coil springs 49a and 49b.

Located on the side of the end wall 81 remote from the three parallel protrusions 83a, 83b, and 83c is a chamber 87 sized to receive the latch pin 55. More specifically, the chamber 87 has a generally rectangular shape, as does the latch pin 55.

Located at one end of the latch pin 55 is a cylindrical protrusion 89. The diameter of the cylindrical protrusion 89 is slightly less than the inner diameter of the smaller coil spring 59. The latch pin 55 and the coil spring 59 are positioned in the chamber 87 such that the coil spring 59 surrounds the cylindrical protrusion 89 and extends between the latch pin 55 and a wall 91 located at one end of the chamber 87. The opposite end of the chamber is open. The pin 55 protrudes outwardly from the open end of the chamber 87 when the coil spring 59 is extended.

A notch 93 is located in one surface of the latch pin 55. The plunger housing 53 includes a main body 95 that is flat and extends outwardly from the chamber 87. The main body 95 is positioned such that one of its major surfaces lies substantially parallel to the inner surface of the notch 93 in the latch pin 55.

The latch pin retraction lever 57 is generally flat and includes a main body 97 that lies adjacent the main body 95 of the plunger housing 53. Extending outwardly from the edge of the main body 97 of the pin retraction lever arm 57 is a tooth 99. The tooth 99 is positioned to lie in the slot 93 in the pin 55.

Extending outwardly from the edge of the main body 97 of the pin retraction lever 57 remote from the tooth 99 is an arm 101. Located at the end of the arm 99 is a retraction lever plunger 103. The retraction lever plunger is flat and lies in a plane that lies orthogonal to the plane of the main body 59 of the latch pin retraction lever 57. A flag 105 is located where the arm 101 joins the body 97.

Located in the center of the main body 97 of the latch pin retraction lever 57 is a hole 107. The hole 107 is positioned to be alignable with a threaded hole 109 formed in the main body 95 of the plunger housing 53.

When the pin 55 is mounted in the chamber 87 and the hole 107 in the main body of the latch pin retention lever 57 is aligned with the hole 109 in the main body 95 of the plunger housing 53, the tooth 99 of the latch pin retention lever 57 is alignable in the notch 93 in the pin 55. As a result, when the latch pin retention lever is rotated around a shaft formed by a hereinafter-described screw that passes through the hole 107, the tooth 99 can move the latch pin 55 in a direction that compresses the small spring 59.

The torsion spring 58 is located between the main body 97 of the latch pin retraction lever 57 and the main body 95 of the plunger housing 53. More specifically, the torsion spring is positioned in a cavity 110 formed in the main body 95 of the plunger housing 53. The torsion spring includes arms and is wound and positioned such that it creates a force that ensures that flag 105 will not be exposed until the related latch pin is fully extended.

Located on the edge of the main body 95 of the plunger housing 53 remote from the edge that includes the wall 81 and the three protrusions 83a, 83b, and 83c is a latch actuating plunger 117. The latch actuating plunger 117 is flat and lies in a plane that lies orthogonal to the plane of the main body 95 of the plunger housing 53.

The plunger housing cover 61 is shaped so as to enclose the chamber 87 and the main body 95 of the plunger housing 53. The plunger housing cover 61 includes a hole 111 for receiving a screw 113. The hole 111 in the plunger housing cover 61 is positioned to be alignable with the hole 107 in the body 97 of the latch pin retraction lever 57 and the hole 109 in the body 95 of the plunger housing 53. As a result, the bolt 113 forms the shaft about which the latch pin retraction lever 57 rotates.

The plunger assembly 57 is assembled by mounting the small coil spring 59 and the latch pin in the chamber 87. Thereafter, the torsion spring 58 is mounted in the cavity 110 and the latch pin retention lever 57 is positioned such that the hole 107 in the main body 97 of the latch pin retention lever 57 is aligned with the hole 109 in the main body 95 of the plunger housing 53. Further, the tooth 99 is positioned in the notch 93 in the pin 55. Thereafter, the plunger housing cover 61 is positioned atop the assembly and the bolt 113 is slid through the hole 111 in the plunger housing cover 61 and the hole 107 in the main body 97 of the latch pin retraction lever 57. The bolt 113 is threaded into the hole 109 in the main body 95 of the plunger housing 53. Thereafter, the plunger assembly 47 is mounted in the latch housing 45.

After being positioned, the large coil springs 49a and 49b are compressed and mounted between the slots 75a and 75b formed in the second wall 69b of the latch housing 45 and the spacing 85a and 85b formed by the protrusions 83a, 83b, and 83c that define the E-shaped end of the plunger housing 53. The large coil springs push the plunger assembly outwardly until shoulders 115 located on opposite sides of the chamber 87 on the side of the chamber remote from the E-shaped side of the plunger housing 53 impinge on the fourth wall 69d of the latch housing 45, on opposite sides of the cutaway 79. After the plunger assembly 47 has been mounted in the latch housing 45 and the large coil springs 49a and 49b installed, the latch housing cover 51 is attached to the latch housing 45 by screws 119 located at opposed corners of the latch housing cover 51, which is rectangular shaped.

During card installation, a daughter card 29 (FIG. 1) is first positioned in a card slot 27 and slid toward the back of the backplane card file 11. After reaching the point where the male connector block 31 starts to engage female connectors (not shown), the installer presses both latch actuation plungers 117 toward the second wall 69b of their respective latch housings 45. As will be readily appreciated from the foregoing description, the installer's pressure is resisted by the large coil springs 49a and 49b, which begin to compress. Initially, the latch pin 55 is held captive by the third wall 69c of the latch housing 45. However, as the force applied to the latch actuation plungers 117 increases, the plunger assembly 47 slides within the housing 45. When the latch pins reach the point where they are aligned with the opening 77 in the third wall 65c of the housing 45, the latch pins 55 slide into the openings 77 and are free to pop out of the openings 77. The plunger assembly 47 continues to slide relative to the latch housing 45 until the latch pins 65 become aligned with the latch pin slots 35 in the card files 11. When this occurs, the latch pins pop out and engage the slots in the card file. In this regard, it should be noted that the length of the openings 77 in the direction of pin movement is greater than the thickness of the pins 55 in the same direction.

The position of the latch pin slots 35 are selected such that the latch pins 55 engage the slots after the force required to compress the coil springs 49a and 49b is equal to or greater than the force required to make the male connector block 31 mate with female connectors located at the back of the card file 11. When the latch pins 55 engage the latch pin slots 35, the latch pin retraction lever 57 pivots outward allowing the flags 105 to become visible. The torsion springs 58 are included to ensure that the flags are not viewable until the pins 55 are fully extended. Thus, the flags indicate that the connectors are mated and that the latch pins 55 have engaged latch pin slots 35. Once a latch pin 55 is engaged with a latch pin slot 35, the card 29 is positively retained with a constant spring load. Any tolerance buildup is accommodated by increases or decreases in the force produced by the large coil springs 49a and 49b, which ensure zero connector gap.

To remove a card, the retraction lever plungers 103 of the latch pin retraction levers are depressed, causing the latch pins 55 to be retracted and disengaged from the latch slots 35. Thereafter, the card can be removed. Ejection levers, if desired, can be used to produce the card extraction force necessary to remove a card.

As will be readily appreciated from the foregoing description, the invention provides a card retention latch that is ideally suited for use in vibration and shock environments, such as those that occur onboard an airplane. The latch retention mechanism compensates for tolerance variations and is designed such that a force adequate to break connectors or overcome a connectors mechanical key features will not be produced. In this regard, the forces produced by finger or thumb pressure against the latch actuating plungers 117 are significantly less than those produced by the lever-like devices of the prior art.

While the preferred embodiment of the invention has been illustrated and described, it is to be understood that, within the scope of the appended claims, various changes can be made therein.

The embodiments of the invention in which an exclusive property or privilege is claimed are defined as follows:

1. A retaining latch suitable for retaining daughter cards in a card file comprising:
   (a) a latch housing containing a hole in one wall;
   (b) a plunger assembly mounted in said housing, said plunger assembly comprising:
      (i) a plunger housing including an open-ended chamber having a longitudinal axis that lies orthogonal to the wall of said housing containing said hole, said plunger housing mounted in said latch housing such that the open end of said chamber is alignable with said hole in said wall of said latch housing;
      (ii) a latch pin mounted in said chamber;
      (iii) first spring means mounted in said chamber for urging said latch pin toward the open end of said chamber; and
      (iv) a retraction lever coupled to said latch pin for moving said latch pin away from the open end of said chamber; and
   (c) second spring means for urging said plunger housing away from a position where the open end of said chamber is aligned with said hole in said wall of said latch housing.

2. A retaining latch as claimed in claim 1 wherein one side of said plunger housing has an E shape and wherein said second spring means comprises a pair of coil springs, said pair of coil springs mounted between said E-shaped side of said plunger housing and a second wall of said latch housing that lies orthogonal to the wall of said latch housing containing said hole.

3. A retaining latch as claimed in claim 2 wherein said plunger housing includes an actuating plunger located on the opposite side of said plunger housing from said side having said E-shaped configuration.

4. A retaining latch as claimed in claim 3 wherein said retraction lever includes a flag that is exposed when said latch pin extends outwardly through said open end of said chamber and said hole in said wall of said latch housing.

5. A retaining latch as claimed in claim 4 wherein said latch pin includes a notch and wherein said retraction lever includes a tooth positioned in said notch in said latch pin.

6. A retaining latch as claimed in claim 5 including a shaft, said retraction lever mounted on said shaft for rotation about said shaft.

7. A retaining latch as claimed in claim 6 including a torsion spring located between said retraction lever and said plunger housing for ensuring that said flag is not exposed until said latch pin is fully extended.

8. A retaining latch as claimed in claim 1 wherein said retraction lever includes a flag that is exposed when said latch pin extends outwardly through said open end of said chamber and said hole in said wall of said latch housing.

9. A retaining latch as claimed in claim 8 wherein said latch pin includes a notch and wherein said retraction lever includes a tooth positioned in said notch in said latch pin.

10. A retaining latch as claimed in claim 9 including a shaft, said retraction lever mounted on said sheet for rotation about said shaft.

11. A retaining latch as claimed in claim 10 including a torsion spring located between said retraction lever and said plunger housing for ensuring that said flag is not exposed until said latch pin is fully exposed.

12. A retaining latch as claimed in claim 1 wherein said latch pin includes a notch and wherein said retraction lever includes a tooth positioned in said notch in said latch pin.

13. A retaining latch as claimed in claim 1 including a shaft, said retraction lever mounted on said shaft for rotation about said shaft.

14. In a card file containing at least one daughter card mounted in a slot in said card file, the improvement comprising a retention latch assembly, said retention latch assembly comprising:
   (a) latch slots located adjacent one side of both ends of the outer edge of said at least one daughter card; and
   (b) two retaining latches, one located on each upper outer corner of said daughter card adjacent said latch slots, each of said retaining latches comprising:
      (1) a latch housing containing a hole in the wall of said housing facing the adjacent latch slot;
      (2) a plunger assembly mounted in said housing, said plunger assembly comprising:
         (i) a plunger housing including an open-ended chamber having a longitudinal axis that lies orthogonal to the wall of said housing containing said hole, said plunger housing mounted in said latch housing such that the open end of said chamber is alignable with said hole in said wall of said latch housing;

(ii) a latch pin mounted in said chamber;

(iii) first spring means mounted in said chamber for urging said latch pin toward the open end of said chamber; and (iv) a retraction lever coupled to said latch pin for moving said latch pin away from the open end of said chamber; and (3) second spring means for urging said plunger housing away from a position where the open end of said chamber is aligned with said hole in said wall of said latch housing.

15. The improvement claimed in claim 14 wherein one side of said plunger housing has an E shape and wherein said second spring means comprises a pair of coil springs, said pair of coil springs mounted between said E-shaped side of said plunger housing and a second wall of said latch housing that lies orthogonal to the wall of said latch housing containing said hole.

16. The improvement claimed in claim 2 wherein said plunger housing includes an actuating plunger located on the opposite side of said plunger housing from said side having said E-shaped configuration.

17. The improvement claimed in claim 3 wherein said retraction lever includes a flag that is exposed when said latch pin extends outwardly through said open end of said chamber and said hole in said wall of said latch housing.

18. The improvement claimed in claim 4 wherein said latch pin includes a notch and wherein said retraction lever includes a tooth positioned in said notch in said latch pin.

19. The improvement claimed in claim 5 including a shaft, said retraction lever mounted on said shaft for rotation about said shaft.

20. The improvement claimed in claim 6 including a torsion spring located between said retraction lever and said plunger housing for ensuring that said flag is not exposed until said latch pin is fully extended into a latch slot.

21. The improvement claimed in claim 14 wherein said retraction lever includes a flag that is exposed when said latch pin extends outwardly through said open end of said chamber and said hole in said wall of said latch housing.

22. The improvement claimed in claim 17 including a torsion spring located between said retraction lever and said plunger housing for ensuring that said flag is not exposed until said latch pin is fully extended into a latch slot.

23. The improvement claimed in claim 14 wherein said latch pin includes a notch and wherein said retraction lever includes a tooth positioned in said notch in said latch pin.

24. The improvement claimed in claim 14 including a shaft, said retraction lever mounted on said shall for rotation about said shaft.

* * * * *

UNITED STATES PATENT AND TRADEMARK OFFICE
CERTIFICATE OF CORRECTION

PATENT NO. : 5,631,808
DATED : May 20, 1997
INVENTOR(S) : P.K. Collins, III

It is certified that error appears in the above-indentified patent and that said Letters Patent is hereby corrected as shown below:

Title page, item

COLUMN     LINE

[56]     Refs. Cited    Before "4105948A1" insert --DE--

Title page, item
[57]     Abstract    "to flow" should read --to allow--
line 25, 8     41    "sheet" should read --shaft--
(Claim 10, line 2)

10     26    "shall" should read --shaft--
(Claim 24, line 2)

Signed and Sealed this

Twenty-third Day of September, 1997

Attest:

BRUCE LEHMAN

*Attesting Officer*     *Commissioner of Patents and Trademarks*